United States Patent
Chang et al.

(10) Patent No.: US 11,031,954 B1
(45) Date of Patent: Jun. 8, 2021

(54) DATA DECODING METHOD USING LDPC CODE AS ERROR CORRECTION CODE AND DATA TRANSMITTING METHOD THEREOF

(71) Applicant: NATIONAL CHIAO TUNG UNIVERSITY, Hsinchu (TW)

(72) Inventors: Hsie-Chia Chang, Hsinchu (TW); Shu Lin, Milpitas, CA (US); Yen-Chin Liao, Hsinchu (TW)

(73) Assignee: National Chiao Tung University, Hsinchu (TW)

( * ) Notice: Subject to any disclaimer, the term of this patent is extended or adjusted under 35 U.S.C. 154(b) by 0 days.

(21) Appl. No.: 16/992,359

(22) Filed: Aug. 13, 2020

(30) Foreign Application Priority Data

May 6, 2020 (TW) .................. 109115069

(51) Int. Cl.
*H03M 13/11* (2006.01)
*H03M 13/29* (2006.01)

(52) U.S. Cl.
CPC .... *H03M 13/1174* (2013.01); *H03M 13/1182* (2013.01); *H03M 13/1185* (2013.01); *H03M 13/2903* (2013.01); *H03M 13/2906* (2013.01); *H03M 13/2948* (2013.01)

(58) Field of Classification Search
CPC ......... H03M 13/1174; H03M 13/2903; H03M 13/2948
See application file for complete search history.

(56) References Cited

U.S. PATENT DOCUMENTS

| 8,516,351 | B2 * | 8/2013 | Sharon | H03M 13/6362 |
|---|---|---|---|---|
|  |  |  |  | 714/790 |
| 2008/0301518 | A1 * | 12/2008 | Miyazaki | H03M 13/1185 |
|  |  |  |  | 714/752 |
| 2009/0164863 | A1 * | 6/2009 | Oh | H03M 13/6393 |
|  |  |  |  | 714/752 |
| 2010/0185914 | A1 * | 7/2010 | Tan | H03M 13/116 |
|  |  |  |  | 714/752 |
| 2010/0325511 | A1 * | 12/2010 | Oh | H03M 13/116 |
|  |  |  |  | 714/752 |

FOREIGN PATENT DOCUMENTS

WO    2017082986 A1    5/2017

OTHER PUBLICATIONS

J. Liu, R.C. De Lamare. "Rate Compatible LDPC Codes Based on Puncturing and Extension Techniques for Short Block Lengths." arXiv:1407.5136 (Jul. 2014), pp. 1-9.

* cited by examiner

*Primary Examiner* — Joseph D Torres
(74) *Attorney, Agent, or Firm* — Rosenberg, Klein & Lee (57) ABSTRACT

A data transmitting method using an LDPC code as an error correction code is provided. The method includes providing a parity check matrix of LDPC code, wherein the size of the parity check matrix is (m1+m2)×(n1+n2); in a sending side, encoding an input data of K bits with a encoder to generate a first block code of (n1+n2) bits, according to the parity check matrix; through a transmitting channel, sending n1 bits of the first block code from the sending side to a receiving side, wherein n2 bits of the first block code are not transmitted; and receiving the n1 bits of the first block code in the receiving side, and using the parity check matrix to perform a decoding algorithm to the received first block code to iterative decodes a second block code of (n1+n2) bits with a decoder. Furthermore, a data decoding method thereof is also provided.

16 Claims, 9 Drawing Sheets

DATA DECODING METHOD USING LDPC CODE AS ERROR CORRECTION CODE AND DATA TRANSMITTING METHOD THEREOF

This application claims priority for Taiwan (R.O.C.) patent application no. 109115069 filed on 6 May 2020, the content of which is incorporated by reference in its entirely.

BACKGROUND OF THE INVENTION

Field of the Invention

The present invention relates to data decoding and transmitting methods, particularly to a data decoding method using an LDPC code as an error correction code and a data transmitting method using the same.

Description of the Related Art

Coding and Decoding technologies are indispensable for communication systems. Recently, the concerned fields have paid much attention to the decoding technology using a low-density parity check (LDPC) code, which is to be used in developing 5G communication systems.

The LDPC code is a linear block code. Therefore, a source information string will be processed by segments in encoding and decoding. In encoding, the information segment is multiplied by a generator matrix to obtain code words with checking bits. The encoded data is transmitted to a receiving side. Then, a parity check matrix examines whether the received code is correct and corrects the received code if necessary.

The following table (S. Lin and D. J. Costello, *Error Correction Codes* (2nd Edition), p 20) shows the limits of the AWGN (Additive White Gaussian Noise) channel. It is known from the channel coding theory: while the code rate is about 0.89, a minor variation of the code rate will result in a significant variation of the channel limit. While the code rate increases from 0.50 to 0.51, the increase of 0.01 in the code rate results in a variation of 0.043 dB in the Shannon limit. While the code rate increases from 0.894 to 0.907, the increase of 0.013 in the code rate results in a variation of 0.198 dB in the Shannon limit, however.

| Code Rate R | Eb/N0 (dB) |
| --- | --- |
| 0.50 | 0.188 |
| 0.51 | 0.233 |
| ... | ... |
| 0.894 | 3.114 |
| 0.907 | 3.312 |

Thus, the actual code rate of a communication system can be increased via using a puncture technology to abandon transmitting a portion of encoded bits. In other words, different puncture rates result in different code rate. While the puncture technology is applied to an LDPC-based communication system, the performance may be reduced if the punctured positions do not match the special check matrix. Therefore, the conventional technology needs to design a check matrix and the circuit thereof to match the application environments of different code rates for raising the effectiveness.

The conventional check matrix is normally adaptive to a special circuit and a special application environment. Once the code rate changes, the user needs to select another check matrix and the corresponding circuit. Therefore, the conventional technology suffers inflexibility of application, complexity of circuit design, and expensiveness of the system.

SUMMARY OF THE INVENTION

The present invention provides a data decoding method using an LDPC code as an error correction code and a data transmitting method using the same, wherein the parity check matrix can be adjusted flexibly to match different code rates.

The present invention proposes a data transmitting method using an LDPC code as an error correction code, which comprises steps: providing a parity check matrix of a low-density parity check (LDPC) code, wherein the parity check matrix has a size of (m1+m2)×(n1+n2) bits; in a sending side, using an encoder to encode a piece of input data with K bits according to the parity check matrix to generate a first block code having a block length of (n1+n2) bits; transmitting n1 bits of the first block code from the sending side to a receiving side through a transmission channel, wherein n2 bits of the first block code are not transmitted; the receiving side receiving the n1 bits of the first block code, and a decoder using the parity check matrix to decode the received first block code and perform iterative operations to generate a second block code having (n1+n2) bits, wherein K, m1, m2, n1 and n2 are positive integers and K is smaller than (n1+n2). The decoder uses a signed number having a sign bit and a numeral value to express the reliability information of each bit of the first block code. The decoder provides a given sign bit and a given numeral value to each of the untransmitted n2 bits of the first block code. In decoding, if the value of the reliability information is exactly the given value, only the given sign bit participates in the iterative operations. In decoding, if the value of the reliability information is not the given value, both the sign bit and the numeral value participate in the iterative operations.

In one embodiment of the present invention, suppose that the parity check matrix is expressed with a Tanner graph; the n1 bits corresponds to the n1 variable nodes of the parity check matrix, and the column weight ranges within [r1, r2]; the n2 bits corresponds to the n2 variable nodes of the parity check matrix, and the column weight ranges within [s1, s2], wherein r1, r2, s1, and s2 are integers greater than or equal to 0, and s1≥r2.

In one embodiment of the present invention, the parity check matrix includes a plurality of local matrixes, and the decoding operation includes steps: respectively using the local matrixes to perform iterative operations to obtain a plurality of local codes; after the local codes are obtained, using the whole parity check matrix to perform iterative operations to obtain the second block code having (n1+n2) bits.

In one embodiment of the present invention, the parity check matrix includes a global matrix, wherein the local matrixes are disposed within the area of top n1×(m1+m2) and distributed along a diagonal; the global matrix is disposed within the area of last n2×(m1+m2).

In one embodiment of the present invention, the parity check matrix includes a global matrix, wherein the local matrixes are disposed within the area of (n1+n2)×top m1 and distributed along a diagonal; the global matrix is disposed within the area of (n1+n2)×last m2; each two of the local matrixes that adjacent to each other have an overlapping portion.

In one embodiment of the present invention, the untransmitted n2 bits are selected randomly.

In one embodiment of the present invention, the parity check matrix includes a plurality of non-zero elements and a plurality of zero elements. The non-zero elements appearing in the columns do not neighbor each other. Alternatively, the non-zero elements appearing in the rows do not neighbor each other.

In one embodiment of the present invention, the parity check matrix includes a plurality of sub-matrixes. Each sub-matrix includes a plurality of non-zero elements and a plurality of zero elements. Each column of each sub-matrix has at most one non-zero element. Each row of each sub-matrix has at most one non-zero element.

The present invention also proposes a data decoding method using an LDPC code as an error correction code, which comprises steps: providing a parity check matrix of a low-density parity check (LDPC) code, wherein the parity check matrix has a size of (m1+m2)×(n1+n2) bits; receiving n1 bits of a first block code; a decoder using the parity check matrix to decode the received first block code and perform iterative operations to generate a second block code having (n1+n2) bits, wherein K, m1, m2, n1 and n2 are positive integers and K is smaller than (n1+n2). The decoder uses a signed number having a sign bit and a numeral value to express the reliability information of each bit of the first block code. The decoder provides a given sign bit and a given numeral value to each of the untransmitted n2 bits of the first block code. In decoding, if the value of the reliability information is exactly the given value, only the given sign bit participates in the iterative operations. In decoding, if the value of the reliability information is not the given value, both the sign bit and the numeral value participate in the iterative operations.

In one embodiment of the present invention, suppose that the parity check matrix is expressed with a Tanner graph; the n1 bits corresponds to the n1 variable nodes of the parity check matrix, and the column weight ranges within [r1, r2]; the n2 bits corresponds to the n2 variable nodes of the parity check matrix, and the column weight ranges within [s1, s2], wherein r1, r2, s1, and s2 are integers greater than or equal to 0, and s1≥r2.

In one embodiment of the present invention, the parity check matrix includes a plurality of local matrixes, and the decoding operation includes steps: respectively using the local matrixes to perform iterative operations to obtain a plurality of local codes; after the local codes are obtained, using the whole parity check matrix to perform iterative operations to obtain the second block code having (n1+n2) bits.

In one embodiment of the present invention, the parity check matrix includes a global matrix, wherein the local matrixes are disposed within the area of top n1×(m1+m2) and distributed along a diagonal; the global matrix is disposed within the area of last n2×(m1+m2).

In one embodiment of the present invention, the parity check matrix includes a global matrix, wherein the local matrixes are disposed within the area of (n1+n2)×top m1 and distributed along a diagonal; the global matrix is disposed within the area of (n1+n2)×last m2; each two of the local matrixes that adjacent to each other have an overlapping portion.

In one embodiment of the present invention, the untransmitted n2 bits are selected randomly.

In one embodiment of the present invention, the parity check matrix includes a plurality of non-zero elements and a plurality of zero elements. The non-zero elements appearing in the columns do not neighbor each other. Alternatively, the non-zero elements appearing in the rows do not neighbor each other.

In one embodiment of the present invention, the parity check matrix includes a plurality of sub-matrixes. Each sub-matrix includes a plurality of non-zero elements and a plurality of zero elements. Each column of each sub-matrix has at most one non-zero element. Each row of each sub-matrix has at most one non-zero element.

The present invention provides a data decoding method and a data transmitting method, which use an LDPC code as an error correction code, wherein a puncture method is used to determine the ratio of n2 and adjust the code rate of the encoded area, whereby to achieve a multi-code rate design.

Below, embodiments are described in detail in cooperation with the attached drawings to make easily understood the objectives, technical contents, characteristics and accomplishments of the present invention.

DETAILED DESCRIPTION OF THE INVENTION

Figure 1:
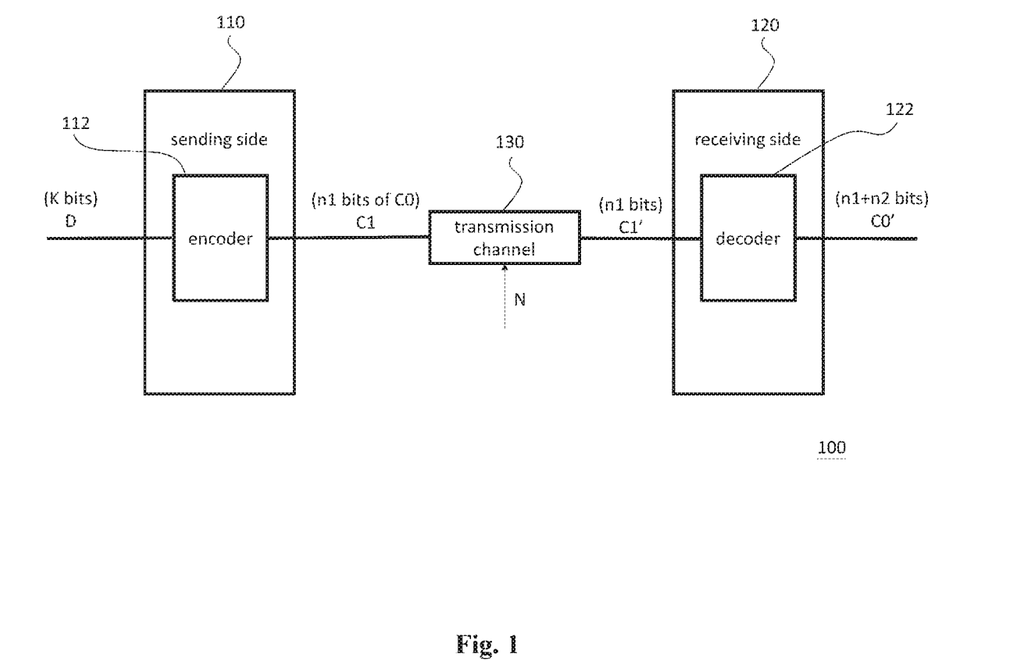
FIG. 1 schematically shows a communication system used by a data transmitting method using an LDPC code as an error correction code according to one embodiment of the present invention.

Refer to FIG. 1. FIG. 1 is a diagram schematically showing a communication system used by a data transmitting method using an LDPC code as an error correction code according to one embodiment of the present invention. The communication system 100 comprises a sending side 110, a receiving side 120, and a transmission channel 130. The sending side 110 includes an encoder 112, which encodes an input data D into a first block code C0. The transmission channel 130 is connected with the sending side 110 and the receiving side 120, transmitting n1 bits of the first block code C0 (a first block code C1) to the receiving side 120. As noise N may interfere with the transmission process, the transmission channel 120 may send out a first block code C1', which carries noise, to the receiving side 120. The receiving side 120 includes a decoder 122, which decodes the first block code C1' to obtain a second block code C0'.

Figure 2:
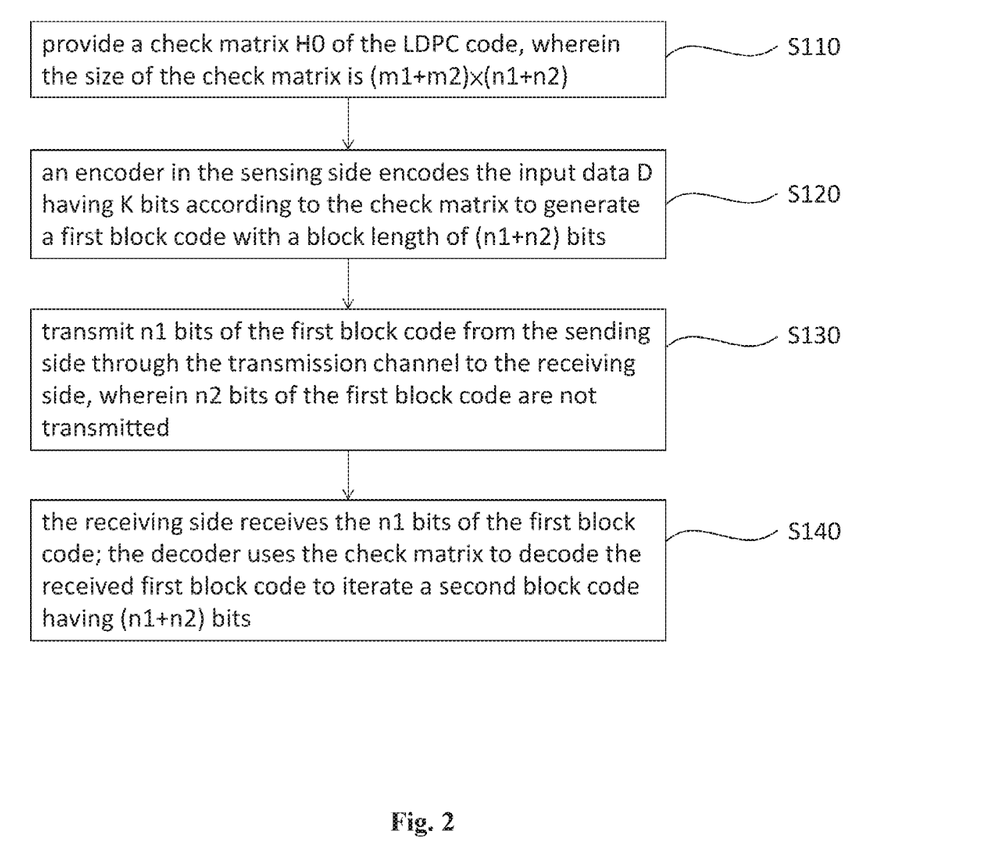
FIG. 2 is a flowchart of a data transmitting method using an LDPC code as an error correction code according to one embodiment of the present invention.

FIG. 2 is a flowchart of a data transmitting method using an LDPC code as an error correction code according to one embodiment of the present invention. Below, the data transmitting method using an LDPC code as an error correction code shown in FIG. 1 will be described in cooperation with the communication system shown in FIG. 1.

Figure 3:
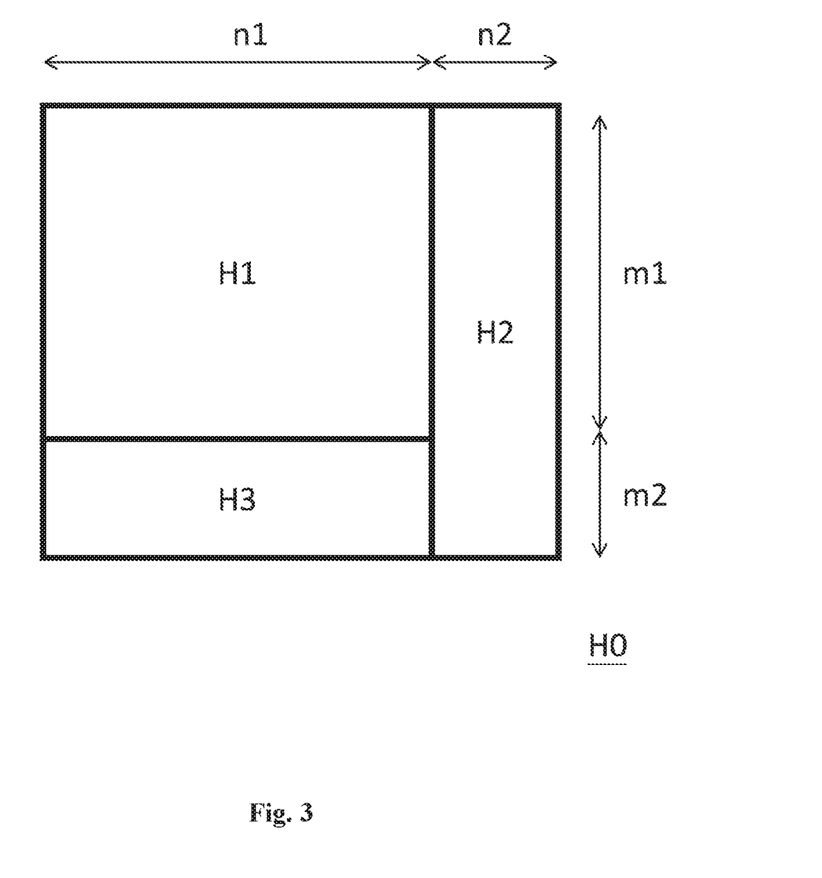
FIG. 3 schematically shows a parity check matrix used by the data transmitting method using an LDPC code as an error correction code shown in FIG. 2.

FIG. 3 is a diagram schematically showing a parity check matrix used by the data transmitting method using an LDPC code as an error correction code shown in FIG. 2. Refer to FIG. 2 and FIG. 3. The process starts from Step S110. In Step S110, provide a parity check matrix H0 of the LDPC code, wherein the size of the parity check matrix is (m1+m2)×(n1+n2). For example, the parity check matrix H0 includes three parts: H1, H2, and H3. Suppose that H0 is the parity check matrix of the first block code C0 and H1 is the parity check matrix of the first block code C1. The code rate of the first block code C0 is R0, and R0≥1−(m1+m2)/(n1+n2). The code rate of the first block code C1 is R1, and R1≥1−m1/n1, wherein m1, m2, n1 and n2 are positive integers. Therefore, R1−R0>0.

In other words, the code rate R1 of the first block code C1 is higher than the code rate R0 of the first block code C0. In the communication system 100, the parity check matrix H0 and a puncture technology may be used to increase the code rate of the transmitted data. The parity check matrix may include a plurality of non-zero elements and a plurality of zero elements. In this embodiment, the non-zero elements appearing in the columns do not neighbor each other. Alternatively, the non-zero elements appearing in the rows do not neighbor each other. Experiments will prove that the abovementioned arrangement can get better error correction capability. In brief, the neighboring columns do not have common positions for non-zero elements; alternatively, the neighboring rows do not have common positions for non-zero elements.

Next, the process proceeds to Step S120. In Step S120, the encoder 112 in the sensing side 110 encodes the input data D having K bits of information according to the parity check matrix H0 to generate a first block code C0 with a block length of (n1+n2) bits. In other words, the encoding generates a first block code C0 with a block length of (n1+n2) bits. Let the first block code C0 be expressed in a vector, and C0=[C1P]$^T$. At this moment, the code rate is R0. In this embodiment, K is a positive integer, and K is smaller than (n1+n2). P is a vector of the n2 bits, expressing the punctured bits.

Next, the process proceeds to Step S130. In Step S130, transmit the n1 bits of the first block code C0 (i.e. the first block code C1) from the sending side 110 through the transmission channel 130 to the receiving side 120, wherein the n2 bits of the first block code C0 are not transmitted. In other words, the n2 bits of the first block code C0, which are corresponding to P, are not transmitted. At this moment, the code rate is increased to R1. The abovementioned step is called the puncture operation. In this embodiment, the n2 bits are corresponding to a parity check matrix H2 of the last few columns of the parity check matrix H0. However, in another embodiment, the positions corresponding to the n2 bits may be selected randomly.

Next, the process proceeds to Step S140. In Step S140, the receiving side 120 receives a first bock code C1' having n1 bits (i.e. the first block code C1 carrying noise N); the decoder 122 uses the parity check matrix H0 to decode the received first block code C1' and perform iterative operations to generate a second block code C0' having (n1+n2) bits. For example, a belief propagation algorithm or a min-sum decoding algorithm may be used to perform decoding.

Furthermore, the decoder 122 uses a signed number containing a sign bit and a numeral value to express the reliability information of each bit of the first block code C0, and assigns a given sign bit and a given numeral value to each of the n2 bits of the first block code, which are not transmitted. In decoding, if the value of the reliability information is exactly the given value, only the given sign bit participates in the iterative operations. In decoding, if the value of the reliability information is not the given value, both the sign bit and the value participate in the iterative operations. For example, the abandoned n2 bits need to be processed specially. In the min-sum decoding algorithm, the reliability information (the log likelihood ratio of the channel) of the abandoned n2 bits are all set to be +0, wherein the given value is 0, and the given sign is +. The min-sum decoding algorithm excludes the sorting operation of the cases where all the values are zero.

It is easily understood: the persons skilled in the art should be able to derive a data decoding method using an LDPC code as an error correction code from Step S110 and Step S140.

Figure 4:
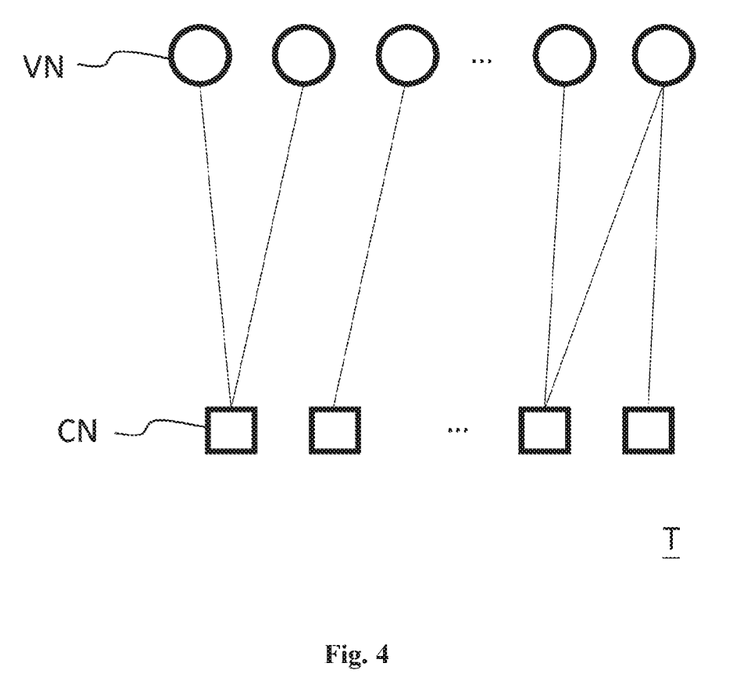
FIG. 4 schematically shows that the matrix in FIG. 3 is expressed with a Tanner graph.

FIG. 4 schematically shows that the matrix in FIG. 3 is expressed with a Tanner graph. Refer to FIG. 4, wherein the parity check matrix H0 is expressed with a Tanner graph T, and wherein the n1 bits are corresponding to n1 variable nodes VN in the parity check matrix, and wherein the n2 bits are corresponding to n2 variable nodes VN in the parity check matrix H0, and wherein m1+m2 (bits) is corresponding to check nodes CN of the Tanner graph.

It is learned from the encoding theory: the block code C0 having a length of n1+n2 has a larger length and a lower code rate than the block code C1 having a length of n1. Thus, it is expected: the block code C0 having a length of n1+n2 has a better error correction ability. However, the puncture operation will lose information and lower the error correction ability. If the puncture operation is directly undertaken without using a specially-designed LDPC parity check matrix, the error correction ability of the block code C0 may become lower than that of the block code C1.

Therefore, while the parity check matrix H0 is constructed, this embodiment further adds the following condition: the column weight corresponding to the abandoned n2 bits (i.e. the number of the non-zero elements in a column) is larger than or equal to the column weight of the parity check matrix [H1$^T$H3$^T$]$^T$, which is corresponding to the n1 bits. In other words, the range of column weight corresponding to the n1 portion is expressed by [r1, r2]; the range of column weight corresponding to the n2 portion is expressed by [s1, s2]. The column weight of the parity check matrix satisfies s1≥r2 wherein r1, r2, s1 and s2 are integers larger than or equal to 0.

It is thus guaranteed via the abovementioned condition: the block code C0 keeps a better error correction ability after the parity check matrix H0 is punctured. In other words, the condition of high column weight guarantees that the other linked bits can fast compensate for the information lost in the puncture operation in the first iterative operation. Besides, the number of the n2 bits abandoned in the puncture operation is also a parameter influencing the recovery and convergence of information. In the present invention, the parameter may be determined by the following two methods:

1. The simulation method: the value of n2 is gradually increased until the decoder 122 cannot decode correctly.
2. The numeral value analysis method: the block code is generated randomly; after the first iterative operation of the statistically-iterative decoding process, the reliability of the punctured n2 bits is transformed to be a correct sign bit ratio, or a probability model thereof is used in estimation, whereby to obtain the optimized column weight range [s1, s2] corresponding to the n2 bits.

The abovementioned parity check matrix H0 may be regarded as a special example of a global-coupled (GC) LDPC parity check matrix. Suppose the GC-LDPC parity check matrix has a structure shown in FIG. 6 or FIG. 7. The structure of the GC-LDPC parity check matrix features a high column weight ratio and may be used to puncture the positions having higher column weights, whereby to adjust the code rate and maintain a better error correction ability. The most significant characteristic of the GC-LDPC parity check matrix is that it regards an LDPC code as a plurality of shorter LDPC local codes. Therefore, the GC-LDPC parity check matrix may implement global-local two-phase decoding.

Figure 5:
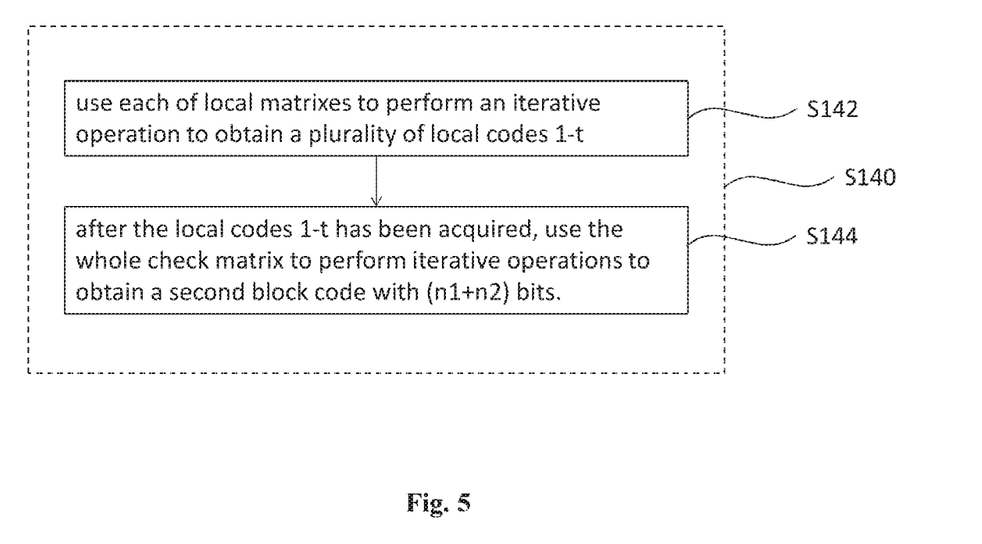
FIG. 5 shows a flowchart of a two-phase decoding operation of the data transmitting method using an LDPC code as an error correction code shown in FIG. 2.
Figure 6:
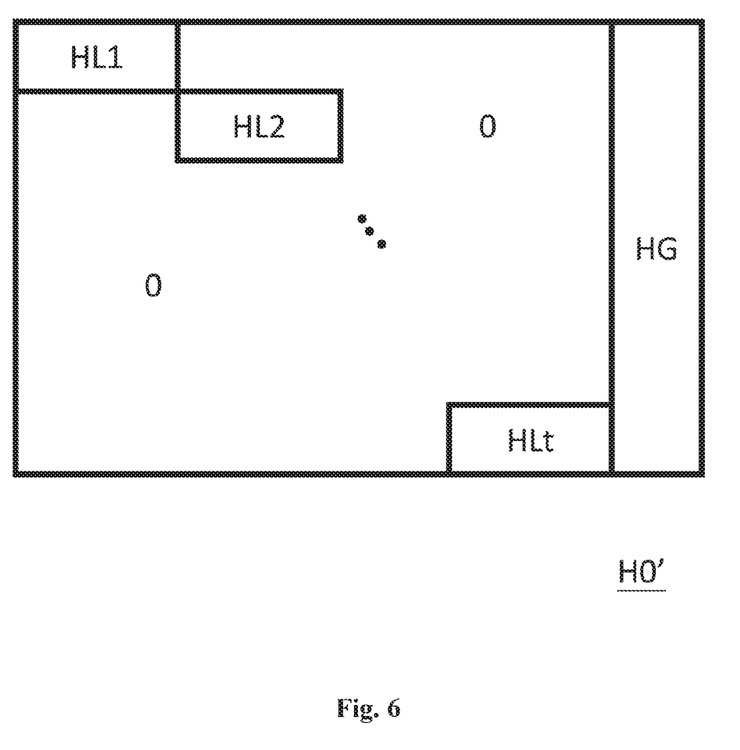
FIG. 6 schematically shows a parity check matrix applied to the two-phase decoding operation shown in FIG. 5 according to one embodiment of the present invention.

FIG. 5 shows a flowchart of a two-phase decoding operation of the data transmitting method using an LDPC code as an error correction code shown in FIG. 2. FIG. 6 is a diagram schematically showing a parity check matrix applied to the two-phase decoding operation shown in FIG. 5 according to one embodiment of the present invention. Refer to FIG. 5 and FIG. 6. The parity check matrix H0' includes a plurality of local matrixes HL1-HLt and a global matrix HG. The local matrixes HL1-HLt are positioned in a region of top n1×(m1+m2) and distributed along a diagonal, wherein t is a positive integer larger than 0. The global matrix GH is positioned in a region of last n2×(m1+m2). If these bits are expressed with a Tanner graph (not shown in the drawings), the n1 bits are corresponding to t local variable nodes, and the n2 bits are corresponding to n2 global variable nodes, wherein the column weight of the variable nodes corresponding the n1 bits ranges within [r1, r2]; the column weight of variable nodes corresponding to the n2 bits ranges within [s1, s2], and wherein s1≥r2.

For example, Step S140 may includes Sub-step S142 and Sub-step S144. In Sub-step S142, use each of the local matrixes HL1-HLt to perform an iterative operation to obtain a plurality of local codes. In a two-phase decoding process, the decoder 122 firstly decodes the local code 1, which is formed by the row of the local matrix H1. Next, the decoder 122 decodes the local codes 2-t, which are corresponding to the local matrixes HL2-HLt. During the two-phase decoding process, the information of the punctured bits (the bits corresponding to HG) is gradually updated.

In Sub-step S144, after the local codes 1-t have been acquired, the whole parity check matrix H0' is used to perform iterative operations to obtain a second block code C0' with (n1+n2) bits. In other words, the while parity check matrix H0' is used to perform global decoding. After several iterative operations, the decoding of the error correction code is completed.

Figure 7:
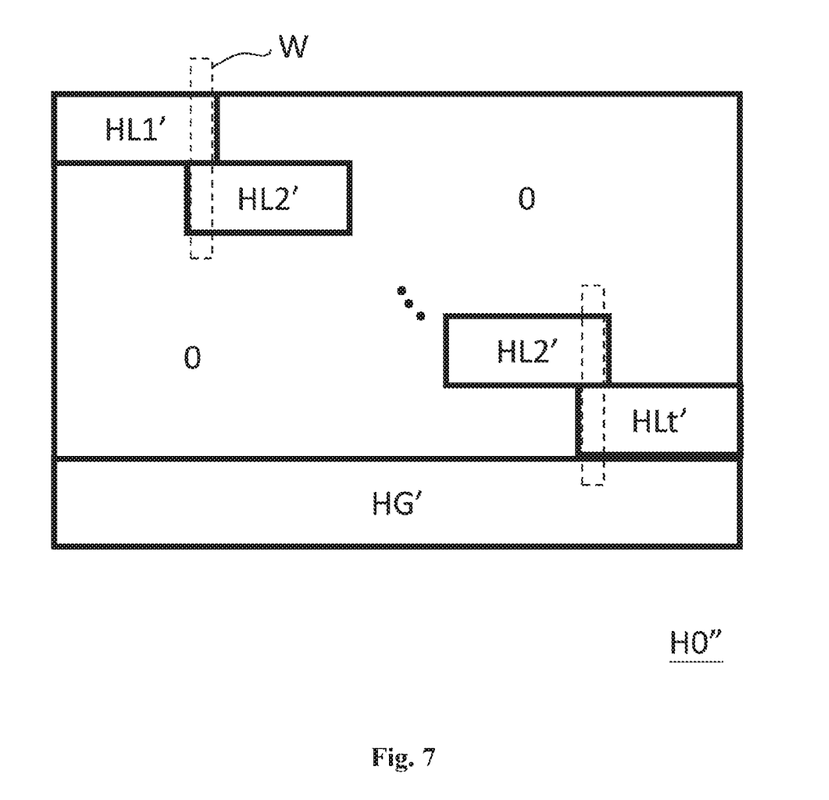
FIG. 7 is a diagram schematically a parity check matrix applied to the two-phase decoding operation shown in FIG. 5 according to another embodiment of the present invention.

FIG. 7 is a diagram schematically showing a parity check matrix applied to the two-phase decoding operation shown in FIG. 5 according to another embodiment of the present invention. In this embodiment, the parity check matrix H0'' includes a plurality of local matrixes HL1'-HLt' and a global matrix HG'. The local matrixes HL1'-HLt' are positioned in a region of (n1+n2)×top m1 and distributed along a diagonal. The global matrix GH' is positioned in a region of (n1+n2)×last m2. Each two of the local matrixes HL1'-HLt' that adjacent to each other have an overlapping portion. If these bits are expressed with a Tanner graph (not shown in the drawings), the m1 local check nodes form t local codes; the m2 local check nodes form m2 global check nodes. At least one identical variable node exists between each two local codes. All the local codes share n2 variable nodes, and the column weight of the variable nodes ranges within [s1, s2]. There are totally n1 residual unshared variable nodes, and the column weight of the unshared variable nodes ranges within [r1, r2], and s1≥r2.

In this embodiment, the GC-LDPC code shown in FIG. 7 may be also decoded in the same two-phase decoding method shown in FIG. 5, and the information of the punctured bits is updated in sequence. The detail thereof will not repeat herein.

In an embodiment that is not illustrated in the drawings, the communication system shown in FIG. 1 and the data transmitting method using an LDPC code as an error correction code shown in FIG. 2 may adopt a quasi-cyclic (QC)-LDPC code-based parity check matrix to enhance the efficiency of hardware. The so-called QC-LDPC code-based parity check matrix may be formed by a plurality of smaller square sub-matrixes, and the punctured positions may have an integer or decimal multiple of the length of the square matrix. Each sub-matrix is a cyclic shifted identity matrix. The cyclic shifted matrix may also be called the circulant permutation matrix (CPM).

For example, the size of a CPM is a 128×128 square matrix, which includes a plurality of non-zero elements and a plurality of zero elements. In the square matrix, each column has at most one non-zero element, and each row also has at most one non-zero element. Therefore, the punctured length of an integer multiple of square matrixes is an integer multiple of 128 bits. If the punctured positions has a length of a decimal multiple of the length of the square matrix, e.g. 0.5 multiple of the length of the square matrix, the punctured positions has a length of 64 bits.

Figure 8A:
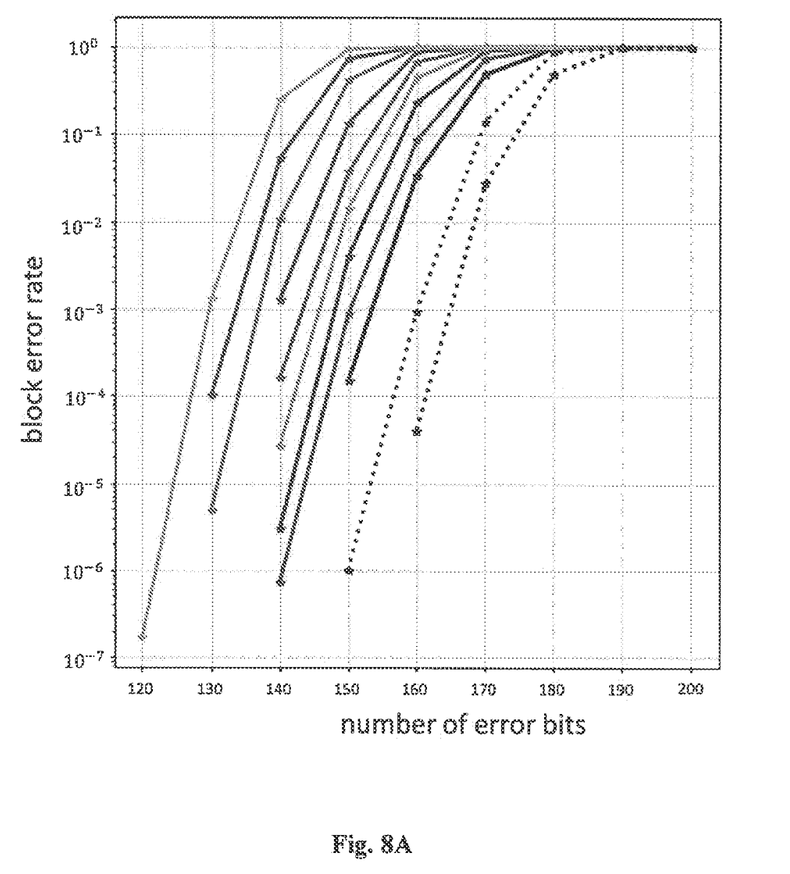
FIG. 8A shows curves each simulating a relationship between the number of the error bits of a block code and the block error rate (BLER) after decoding.
Figure 8B:
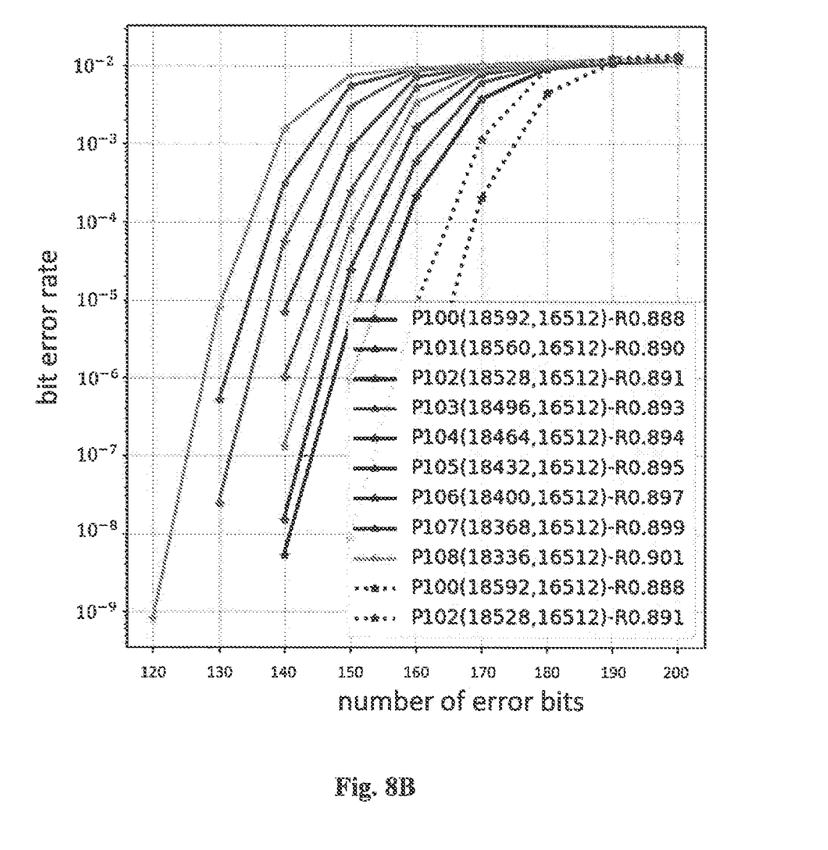
FIG. 8B shows curves each simulating a relationship between the number of the error bits of a block code and the bit error rate (BER) after decoding.

FIG. 8A shows curves each simulating a relationship between the number of the error bits of a block code and the block error rate (BLER) after decoding. FIG. 8B shows curves each simulating a relationship between the number of the error bits of a block code and the bit error rate (BER) after decoding. In FIG. 8A and FIG. 8B, the horizontal axis represents the number of the error bits of a block code, and the vertical axis represents the average error rate after decoding. In each simulation, n error bits are randomly selected from the unpunctured positions in the encoded block. Therefore, the horizontal axis in FIG. 8A and FIG. 8B represents different values of n, and the vertical axis represents the average error rate corresponding to different values of n.

In FIG. 8A, the vertical axis represents the block error rate (BLER), and the block error rate is calculated according to a formula: the number of the error blocks/the total number of the simulated blocks, wherein the error block is defined as follows: as long as a bit of a decoded block is incorrectly decoded, the decoded block is regarded as an error block. In FIG. 8B, the vertical axis represents the bit error rate (BER), and the bit error rate is calculated according to a formula: the total number of the error bits/(the block length×the total number of the simulated blocks).

FIG. 8A and FIG. 8B have many curves respectively involving a big check matrix where 32 bits (i.e. 4-bit bytes) are punctured in sequence. Therefore, there are different combinations of (n1, K) and code rates R. Based on the simulation results, the present invention can select the number of punctures (i.e. n2 of the untransmitted bits) to obtain the required code rate and error rate, exempted from selecting a specialized parity check matrix or redesigning the circuit.

In conclusion, the design of the LDPC code of a general NAND flash memory is stressed on two requirements: large block length and high code rate. The former is to guarantee superior error correction ability, and the latter is to reduce the cost of data bit storage. The abovementioned embodiments of the present invention propose a method of generating a global-coupled LDPC parity check matrix. The present invention features a puncture technology and a special decoding technology, outperforming the other LDPC codes having the same code rate in having better error correction ability. Moreover, the present invention has the following characteristics:

1. The present invention keeps the characteristics of the global-coupled structure parity check matrix and is able to satisfy the throughput of high-speed encoding and decoding, such as the requirement of a NAND flash memory.
2. The present invention designs different column weights for the punctured positions (the number of the non-zero elements in a column) for the parity check matrix and cooperates with a special decoding method to obtain a better error correction ability.
3. The present invention uses a puncture technology to increase the code rate from R0 to R1, i.e. R0<R1. In comparison with the conventional technology that directly designs an LDPC code with a code rate of R1, the present invention uses the puncture technology to generate an LDPC code and thus has more parity check equations. Hence, the present invention is more likely to achieve a better error correction effect.
4. The present invention uses a global/local two-phase decoding technology to gradually update and amend the bits lost in puncture.
5. The present invention adopts a QC-LDPC-structured parity check matrix, wherein the parity check matrix includes a plurality of sub-matrixes in form of smaller square matrixes, and wherein the length of the punctured positions may be an integer or decimal multiple of a sub-matrix. Thereby, the hardware may operate more efficiently.
6. The present invention may use the puncture technology to determine the ratio of n2 and thus vary the code rate of the encoded block. Thus, the present invention can achieve a multi-code rate design.

The embodiments have been described above to demonstrate the technical thoughts and characteristics of the present invention and enable the persons skilled in the art to understand, make, and use the present invention. However, these embodiments are only to exemplify the present invention but not to limit the scope of the present invention. Any modification or variation according to the spirit of the present invention is to be also included by the scope of the present invention.

What is claimed is:

1. A data transmitting method using a low-density parity check (LDPC) code as an error correction code, comprising steps:

providing a parity check matrix of an LDPC code, wherein said parity check matrix has a size of (m1+m2)×(n1+n2);

using an encoder to encode an input data having K bits in a sending side according to said parity check matrix to generate a first block code having a block length of (n1+n2) bits;

transmitting n1 bits of said first block code from said sending side through a transmission channel to a receiving side, wherein n2 bits of said first block code are not transmitted; and said receiving side receiving n1 bits of said first block code, and a decoder using said parity check matrix to undertake a decoding operation of received said n1 bits of said first block code and perform iterative operations to generate a second block code having (n1+n2) bits, wherein K, m1, m2, n1 and n2 are positive integers and K is smaller than (n1+n2), and wherein said decoder uses a signed number including a sign bit and a numeral value to express reliability information of each bit of said first block code, and assigns a given sign bit and a given value to each of said n2 bits of said first block code, which are not transmitted;

during said decoding operation, if said numeral value of said reliability information is said given value, only said given sign bit participates in said iterative operations;

during said decoding operation, if said numeral value of said reliability information is not said given value, said sign bit and said numeral value participate in said iterative operations.

2. The data transmitting method using a low-density parity check (LDPC) code as an error correction code according to claim 1, wherein while said parity check matrix is expressed with a Tanner graph; said n1 bits corresponds to n1 variable nodes of said parity check matrix, and a column weight ranges within [r1, r2]; said n2 bits corresponds to n2 variable nodes of said parity check matrix, and a column weight ranges within [s1, s2], and wherein r1, r2, s1, and s2 are integers greater than or equal to 0, and s1≥r2.

3. The data transmitting method using a low-density parity check (LDPC) code as an error correction code according to claim 1, wherein said parity check matrix includes a plurality of local matrixes, and said decoding operation includes steps:

using each of said local matrixes to perform iterative operations to work out a plurality of local codes; and after said local codes are acquired, using total said parity check matrix to perform iterative operations to obtain said second block code with (n1+n2) bits.

4. The data transmitting method using a low-density parity check (LDPC) code as an error correction code according to claim 3, wherein said parity check matrix further comprises a global matrix, and wherein said local matrixes are disposed within an area of top n1×(m1+m2) and distributed along a diagonal; said global area is disposed within an area of last n2×(m1+m2).

5. The data transmitting method using a low-density parity check (LDPC) code as an error correction code according to claim 3, wherein said parity check matrix further comprises a global matrix, and wherein said local matrixes are disposed within an area of (n1+n2)×top m1 and distributed along a diagonal; said global matrix is disposed within an area of (n1+n2)×last m2; each two of said local matrixes that adjacent to each other have an overlapping portion.

6. The data transmitting method using a low-density parity check (LDPC) code as an error correction code according to claim 1, wherein said n2 bits, which are not transmitted, are selected randomly.

7. The data transmitting method using a low-density parity check (LDPC) code as an error correction code according to claim 1, wherein said parity check matrix includes a plurality of non-zero elements and a plurality of zero elements; said non-zero elements appearing in columns do not neighbor each other; alternatively, said non-zero elements appearing in rows do not neighbor each other.

8. The data transmitting method using a low-density parity check (LDPC) code as an error correction code according to claim 1, wherein said parity check matrix includes a plurality of sub-matrixes; each of said sub-matrixes includes a plurality of non-zero elements and a plurality of zero elements; each column of each said sub-matrix has at most one said non-zero element; each row of each said sub-matrix has at most one said non-zero element.

9. A data decoding method using a low-density parity check (LDPC) code as an error correction code, comprising steps:
providing a parity check matrix of an LDPC code, wherein said parity check matrix has a size of (m1+m2)×(n1+n2); and
receiving n1 bits of a first block code, and a decoder using said parity check matrix to undertake a decoding operation of received said first block code and perform iterative operations to generate a second block code having (n1+n2) bits,
wherein K, m1, m2, n1 and n2 are positive integers and K is smaller than (n1+n2), and
wherein said decoder uses a signed number including a sign bit and a numeral value to express reliability information of each bit of said first block code, and assigns a given sign bit and a given value to each of n2 bits of said first block code, which are not transmitted;
during said decoding operation, if said numeral value of said reliability information is said given value, only said given sign bit participates in said iterative operations;
during said decoding operation, if said numeral value of said reliability information is not said given value, said sign bit and said numeral value participate in said iterative operations.

10. The data decoding method using a low-density parity check (LDPC) code as an error correction code according to claim 9, wherein while said parity check matrix is expressed with a Tanner graph; said n1 bits corresponds to n1 variable nodes of said parity check matrix, and a column weight ranges within [r1, r2]; said n2 bits corresponds to n2 variable nodes of said parity check matrix, and a column weight ranges within [s1, s2], and wherein r1, r2, s1, and s2 are integers greater than or equal to 0, and s1≥r2.

11. The data decoding method using a low-density parity check (LDPC) code as an error correction code according to claim 9, wherein said parity check matrix includes a plurality of local matrixes, and said decoding operation includes steps:
using each of said local matrixes to perform iterative operations to work out a plurality of local codes; and
after said local codes are acquired, using total said parity check matrix to perform iterative operations to obtain said second block code with (n1+n2) bits.

12. The data decoding method using a low-density parity check (LDPC) code as an error correction code according to claim 11, wherein said parity check matrix further comprises a global matrix, and wherein said local matrixes are disposed within an area of top n1×(m1+m2) and distributed along a diagonal; said global area is disposed within an area of last n2×(m1+m2).

13. The data decoding method using a low-density parity check (LDPC) code as an error correction code according to claim 11, wherein said parity check matrix further comprises a global matrix, and wherein said local matrixes are disposed within an area of (n1+n2)×top m1 and distributed along a diagonal; said global matrix is disposed within an area of (n1+n2)×last m2; each two of said local matrixes that adjacent to each other have an overlapping portion.

14. The data decoding method using a low-density parity check (LDPC) code as an error correction code according to claim 9, wherein said n2 bits, which are not transmitted, are selected randomly.

15. The data decoding method using a low-density parity check (LDPC) code as an error correction code according to claim 9, wherein said parity check matrix includes a plurality of non-zero elements and a plurality of zero elements; said non-zero elements appearing in columns do not neighbor each other; alternatively, said non-zero elements appearing in rows do not neighbor each other.

16. The data decoding method using a low-density parity check (LDPC) code as an error correction code according to claim 9, wherein said parity check matrix includes a plurality of sub-matrixes; each of said sub-matrixes includes a plurality of non-zero elements and a plurality of zero elements; each column of each said sub-matrix has at most one said non-zero element; each row of each said sub-matrix has at most one said non-zero element.

* * * * *